Figure 1:
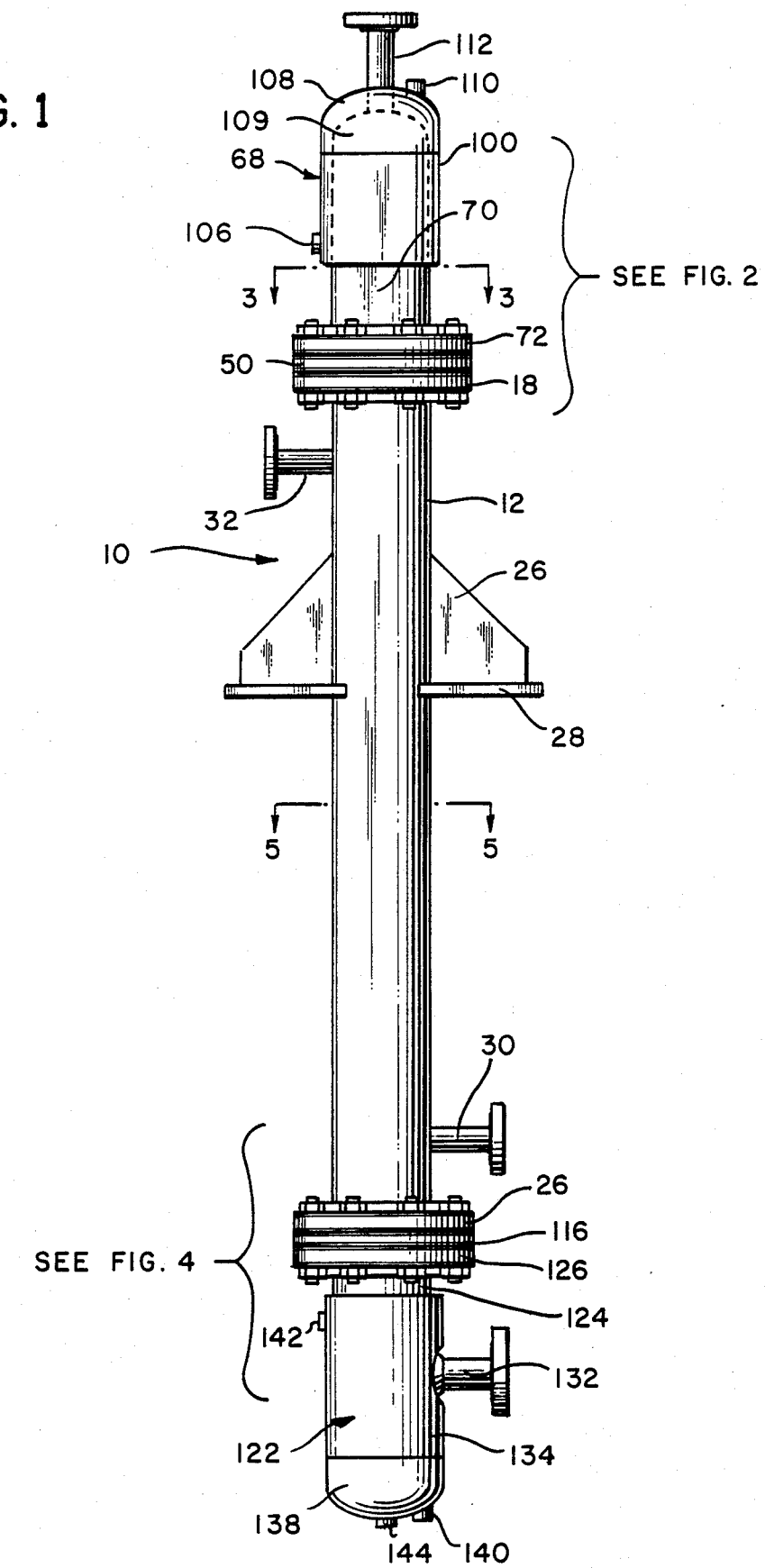

United States Patent [19]

McKown

[11] Patent Number: 4,924,936
[45] Date of Patent: May 15, 1990

[54] MULTIPLE, PARALLEL PACKED COLUMN VAPORIZER

[75] Inventor: Clem McKown, Lake Hopatcong, N.J.

[73] Assignee: M&T Chemicals Inc., Woodbridge, N.J.

[21] Appl. No.: 82,011

[22] Filed: Aug. 5, 1987

[51] Int. Cl.⁵ .................. C23C 16/00; F02M 23/14; F02M 31/00
[52] U.S. Cl. .................. 165/47; 118/715; 118/726; 261/153; 159/13.2; 165/115; 165/118
[58] Field of Search ............... 261/153; 118/715, 726, 118/724, 725; 159/13.2; 165/115, 118

[56] References Cited

U.S. PATENT DOCUMENTS

| | | | |
|---|---|---|---|
| 1,763,508 | 6/1930 | Fowler | 261/153 |
| 2,316,564 | 4/1943 | Cockerill | 165/115 |
| 2,562,495 | 7/1951 | Hulme | 159/13.2 |
| 2,758,061 | 8/1956 | Geller | 159/13.2 |
| 3,087,533 | 4/1963 | Graumann et al. | 159/13.2 |
| 3,499,734 | 3/1970 | Newman et al. | 261/153 |
| 3,568,462 | 3/1971 | Hoffman et al. | 261/153 |
| 3,850,679 | 11/1974 | Sopko et al. | 117/106 |
| 3,876,410 | 4/1975 | Scholes | 65/60 |
| 3,888,649 | 6/1975 | Simhan | 65/60 |
| 4,023,949 | 5/1977 | Schlom et al. | 261/153 |
| 4,212,663 | 7/1980 | Aslami | 118/726 |
| 4,359,493 | 11/1982 | Henery | 427/255 |
| 4,387,134 | 6/1983 | Kalbskopf et al. | 428/215 |
| 4,389,234 | 6/1983 | Lindner | 65/60 |
| 4,524,718 | 6/1985 | Gordon | 118/718 |
| 4,584,206 | 4/1986 | Sleighter | 427/109 |
| 4,600,654 | 7/1986 | Lindner | 428/432 |
| 4,683,025 | 7/1987 | Flores | 165/115 |
| 4,705,654 | 11/1987 | Niwa et al. | 261/153 |

Primary Examiner—John Ford
Attorney, Agent, or Firm—S. A. Marcus; R. B. Henn; R. G. Ort

[57] ABSTRACT

A multiple, parallel packed column vaporizer for vaporizing a chemical having a relatively low decomposition temperature includes a shell; a plurality of parallel, vertically oriented vaporization columns arranged in the shell, each vaporization column having inner walls and upper and lower open ends; a distribution assembly for distributing the chemical substantially equally to the open upper ends of the vaporization columns, which flows downwardly therein; a heat exchanger which heats the vaporization columns to provide the heat needed to vaporize the chemical therein; and a gas supply which supplies the gas to the lower ends of the vaporization columns so that the chemical is vaporized and becomes entrained in the gas and is carried upwardly out of the vaporizer.

17 Claims, 7 Drawing Sheets

MULTIPLE, PARALLEL PACKED COLUMN VAPORIZER

BACKGROUND OF THE INVENTION

This invention relates generally to vaporizers, and more particularly, is directed to a vaporizer which produces a vaporized coating compound entrained in a gas stream, for use in depositing a thin inorganic film by pyrolytic chemical vapor deposition (CVD) onto a substrate.

The desirability of applying uniform coatings to substrates, such as flat glass, glass bottles and the like for varying the mechanical, thermal, optical, chemical resistance and/or electrical properties of the glass, has long been recognized. Such coatings are generally formed from a coating chemical, e.g. a metal compound, such as an organotin compound or the like. These coatings may be deposited using a pyrolytic CVD method. Thus, for example, where coating of a flat glass substrate is involved, as a hot, freshly formed glass ribbon travels from a flat glass forming section to an annealing section, a metal or metal oxide coating is deposited on one face thereof by at least one nozzle which directs a jet of gas containing such coating compound onto the exposed face of the glass ribbon. Reaction components and unused coating compound are removed by an exhaust duct. In the case where glass bottles are coated, the glass bottles travel through a coating hood where they are coated by the coating compound vaporized in a gas stream.

Conventional systems of the type for coating a flat glass substrate are disclosed in U.S. Pat. Nos. 4,359,493; 4,387,134; 4,524,718; 4,584,206 and 4,600,654. On the other hand, conventional systems for applying a coating compound to glass bottles are disclosed in U.S. Pat. Nos. 3,516,811; 3,684,469; 3,819,404; 3,876,410; 3,933,457 and 4,389,234.

In such systems, it is necessary first to vaporize the coating compound and entrain the same in a gas stream which carries the vaporized coating compound to the glass surface to be coated. In this regard, reference is made to the aforementioned U.S. Pat. Nos. 3,876,410; 4,387,134; and 4,600,654, all of which disclose vaporizers or evaporators in a general sense.

A vaporizer is known from U.S. Pat. Nos. 3,850,679; 3,888,649; 3,942,469; 3,970,037; and 4,359,493, all assigned to PPG Industries, Inc. As disclosed in these patents, the vaporizer includes a large cylindrical chamber which is horizontally oriented. A heater is mounted within the vaporizer chamber in a manner so as to divide the chamber into two portions, an upper one into which all incoming materials enter and a lower one from which departing vapors leave. The heater is so constructed that vapors pass through it from the entrance portion to the exit portion, and a preferred embodiment of the heater is a finned tube heat exchanger having a thermally controlled heat exchange fluid supplied to the tubes thereof. A carrier gas and the coating compound to be vaporized are introduced by a spray at the upper portion of the chamber. After contacting the heat exchanger, the coating compound is vaporized and entrained in the gas and exits through the lower portion of the chamber.

It is preferably to use a chemical vapor deposition (CVD) technique to coat the glass surfaces, since this offers advantages in uniformity and deposition rate, due to less glass cooling. With such technique, organotin compounds, such as monobutyltin trichloride, are suitable for depositing thin $SnO_2$ films. These chemicals typically have relatively low decomposition temperatures. Organotin compounds that are significantly more volatile than monobutyltin trichloride tend to be more toxic, and therefore present exposure problems in the work place. For this additional reason, monobutyltin trichloride is preferably used as a coating compound. When a conductive $SnO_2$ film is required, a dopant precursor, such as an organic fluoride compound, may be added to the organotin.

Laboratory tests have indicated that it is generally desirable to have a high concentration of organotin compound in the vapor stream while coating, for example, on the order of 2–15 mole %. In small scale operations, high vapor concentrations are achieved by co-feeding preheated gas and liquid coating formula into a substantially tubular vaporizer, whereby air and liquid coating formula flow concurrently, with the liquid wetting all or a fraction of the vaporizer walls. Heat is provided by conduction through the vaporizer walls from an outside source, such as an electrical resistance heater or circulating heat transfer fluid, as discussed above with the aforementioned PPG patents.

However, during scale-up of such construction, difficulties can arise. This can be explained as follows. For a given vaporizer length, the heat and mass transfer area increases in proportion to the diameter of the vaporizer. However, the hydraulic capacity, that is, the capacity at which the coating compound can be supplied is approximately proportional to the cross-sectional area of the vaporizer, or the square of the diameter. Therefore, to maintain sufficient heat and mass transfer area during scale-up, an increase in the length of the vaporizer approximately proportional to the increase in capacity is required, resulting in an increased cost of construction and operation of the vaporizer.

Therefore, even at the laboratory scale, it is necessary to operate vaporizers of this type with wall temperatures exceeding the decomposition temperature, that is, the temperature at which decomposition of the organotin compound becomes noticeable, in order to prevent the vaporizer from becoming excessively long, while at the same time, providing a high concentration of the coating compound in the gas stream. As a result, known vaporizers are inefficient where it is desired to vaporize organotin compounds having low decomposition temperatures.

Further, the vaporization temperature must be less than the decomposition temperature, that is, the temperature at which the vaporized coating compound will break up on the substrate and form solids; otherwise, the vaporizing surface will become soiled and the vaporizer plugged. The problem, however, is that the vaporization temperature approaches the decomposition temperature at high vapor concentrations.

Therefore, it is desirable to obtain high vapor concentrations while also providing a high efficiency of the vaporizer. It is important to note that high concentrations can be achieved at low surface temperature, and that the approach to equilibrium can be close.

OBJECTS AND SUMMARY OF THE INVENTION

Accordingly, it is an object of the present invention to provide a multiple, parallel packed column vaporizer for vaporizing organotin compounds having relatively low decomposition temperatures.

It is another object of the present invention to provide a multiple, parallel packed column vaporizer having a large capacity which is suitable for large scale applications.

It is still another object of the present invention to provide a multiple, parallel packed column vaporizer which provides a sufficiently high heat and mass transfer to achieve high concentrations of coating chemicals in the vapor stream without reaching the temperature of deposition.

It is yet another object of the present invention to provide a multiple, parallel packed column vaporizer that has a high surface area for heat and mass transfer, and a high heat transfer rate with relatively low surface temperatures and little decomposition.

In accordance with an aspect of the present invention, apparatus is provided for vaporizing a compound or mixture of compounds, e.g. a coating chemical, having a relatively low decomposition temperature to produce a coating mixture comprised of a high concentration of vaporized coating compound entrained in a gas, the vaporizer including a shell; a plurality of packed vaporization columns arranged in the shell in a substantially vertical orientation, the vaporization columns having inner walls and upper and lower open ends; distribution means for distributing the coating compound substantially equally to the upper open ends of the vaporization columns; heating means for heating the vaporization columns to provide the heat needed to vaporize the coating compound therein; and gas supply means for supplying the gas to the lower ends of the vaporization columns to produce the coating mixture.

The above and other objects, features and advantages of the present invention will become readily apparent from the following detailed description thereof which is to be read in connection with the accompanying drawings.

BRIEF DESCRIPTION OF THE DRAWINGS

FIG. 1 is an elevational view of a vaporizer according to one embodiment of the present invention;

FIG. 2 is a longitudinal cross-sectional view of the liquid feed section of the vaporizer of FIG. 1;

FIG. 3 is a cross-sectional view of the liquid feed section of FIG. 2, taken along line 3—3 thereof;

FIG. 4 is a longitudinal cross-sectional view of the packing support section of the vaporizer of FIG. 1;

FIG. 5 is a cross-sectional view of the vaporizer of FIG. 1, taken along line 5—5 thereof;

FIG. 6 is a longitudinal cross-sectional view of a vaporizer according to another embodiment of the present invention;

FIG. 7 is a plan view of the feed distributor of the vaporizer of FIG. 6;

FIG. 8 is a cross-sectional view, showing attachment and leveling means of the feed distributor of FIG. 7 to the vaporizer of FIG. 6;

FIG. 9 is a cross-sectional view, showing attachment of an overflow weir tube of the vaporizer of FIG. 6 secured to the feed distributor of FIG. 7;

FIG. 10 is a cross-sectional view of the vaporizer of FIG. 6, taken along line 10—10 thereof;

FIG. 11 is a plan view of the support plate of the vaporizer of FIG. 6; and

FIG. 12 is a cross-sectional view of the support plate of FIG. 11, taken along line 12—12 thereof, showing the mesh wire cones secured thereon.

DETAILED DESCRIPTION OF THE PREFERRED EMBODIMENTS

Referring to the drawings in detail, and initially to FIGS. 1–5, a multiple, parallel packed column vaporizer 10 according to a first embodiment of the present invention includes an elongated hollow cylindrical shell 12 that is open at its upper end 14 and lower end 16, as shown in FIGS. 2 and 4. An upper shell flange 18 is secured to and surrounds upper open end 14 and, in like manner, a lower shell flange 20 surrounds and is connected to lower open end 16 of shell 12. Upper shell flange 18 is provided with a plurality of apertures 22 spaced therearound and, in like manner, lower shell flange 20 is provided with a plurality of apertures 24 spaced therearound, the purpose for which will be described in greater detail hereinafter. Further, vertical support plates 27 and horizontal support plates 28 are secured to the outer surface of shell 12 between upper and lower shell flanges 18 and 20 for securing vaporizer 10 to a support structure (not shown). As will also be described in greater detail hereinafter, vaporizer 10 functions as a heat exchanger, whereby heat is transferred from a hot liquid, such as a hot oil, which is passed through the shell 12 of vaporizer 20 to vaporize the coating compounds supplied thereto. In this regard, shell 12 is provided with a hot oil inlet nozzle 30 at the lower end thereof for supplying hot oil to the interior of shell 12, and a hot oil outlet nozzle 32 at the upper end of shell 12 for removing the hot oil therefrom.

A plurality of tubular vaporization columns 34 are positioned in spaced, vertical, and parallel relation to each other within shell 12. Vaporization columns 34 are packed with a packing material, such as ¼ inch nickel saddles, to provide mass transfer area for vaporization. The packing material also serves to conduct heat into the interior of the columns from the column's inner wall. Any relatively chemically inert packing material may be used. Packing materials having a relatively high thermal conductivity are preferred.

In the first embodiment of the invention, there are ten vaporization columns 34 that are provided, although this number can vary within the scope of the present invention. Vaporization columns 34 are maintained in the aforementioned spaced, vertical and parallel relation by a plurality of baffle plates 36, one of which is shown in FIG. 5. As shown, baffle plates 36 are provided with a clearance 38 from the inner wall of shell 12, and each baffle plate 36 is also cut-away, as at 40 to provide a larger clearance 42. Clearances 38 and 42 permit hot oil supplied to hot oil inlet nozzle 30 to travel upwardly through shell 12 to hot oil outlet nozzle 32, which also providing heat exchange with the coating compound traveling through vaporization columns 34. The orientation of clearance 42 alternates in successive baffle plates 36 to insure uniform heating of vaporization columns 34. In addition, a plurality of baffle support rods 44 extend through apertures 46 in baffle plates 36 to support baffle plates 36 and to maintain all baffle plates 36 in alignment with each other. Further, the upper ends of vaporization columns 34 are welded within apertures 48 in an upper tube sheet 50 positioned immediately above upper shell flange 18. Upper tube sheet 50 functions as a seal to prevent hot oil from escaping from the shell 12. A gasket seal 53 is provided between flange 18 and upper tube sheet 50, which also functions to prevent escape of hot oil from the upper end of shell 12. Therefore, hot oil is required to exit through hot oil outlet nozzle 32.

Figure 4:
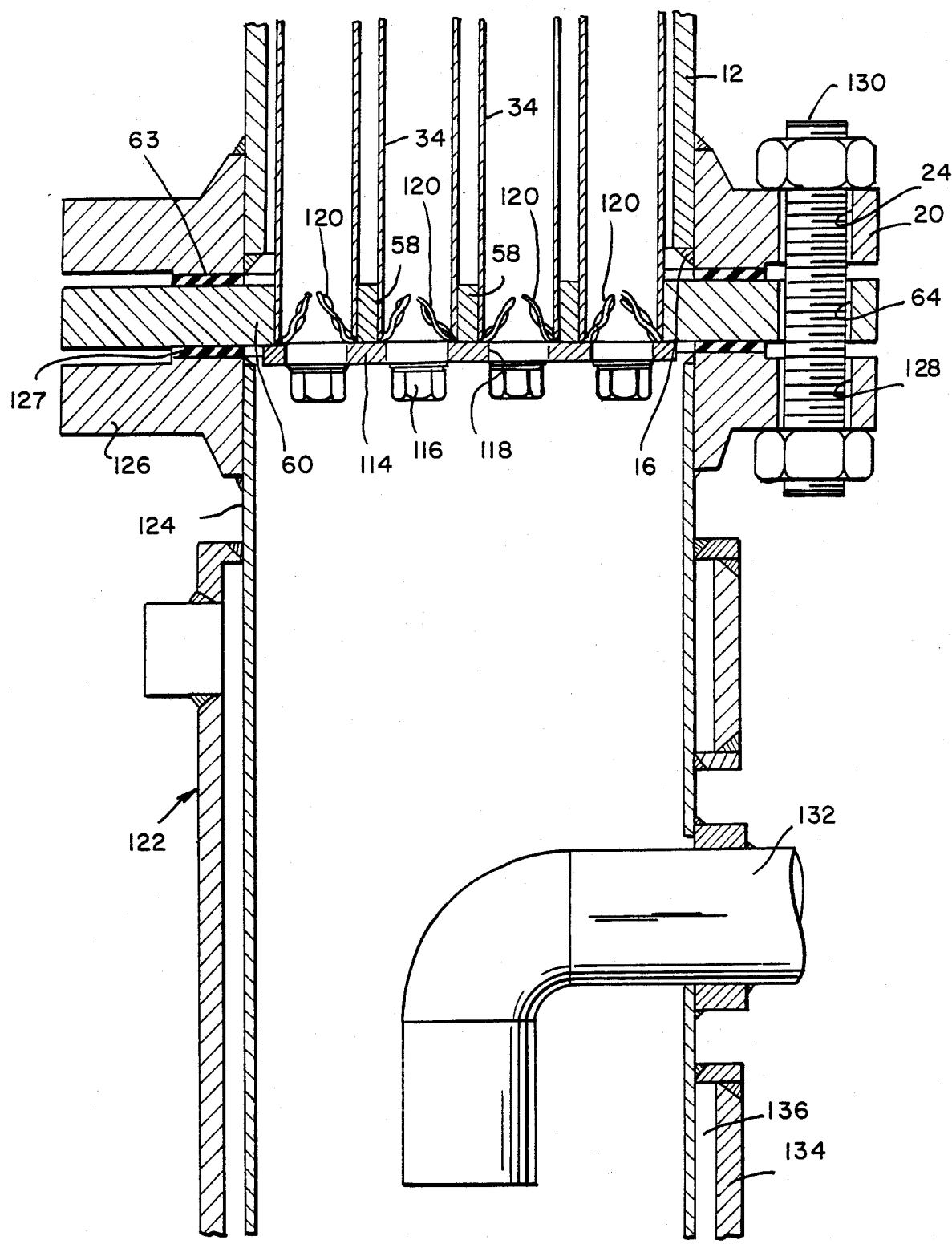
Figure 5:
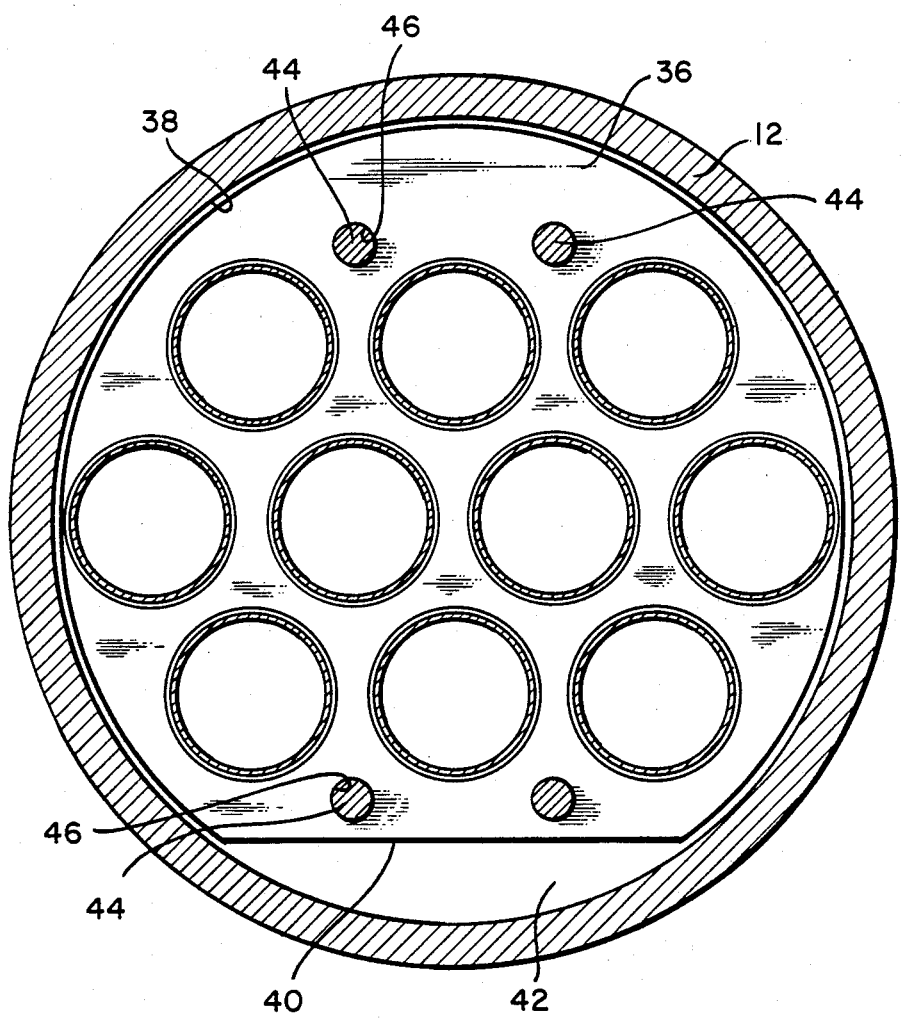

In like manner, as shown in FIG. 4, the lower ends of vaporization columns 34 are secured and sealed within apertures 58 in a lower tube sheet 60 positioned immediately below lower shell flange 20 and in alignment therewith. Lower tube sheet 60 includes a plurality of spaced apertures 64 in alignment with apertures 24 of lower shell flange 20. A gasket seal 63 is provided between flange 20 and lower tube sheet 60 for preventing oil from escaping from the lower portion of shell 12.

Figure 2:
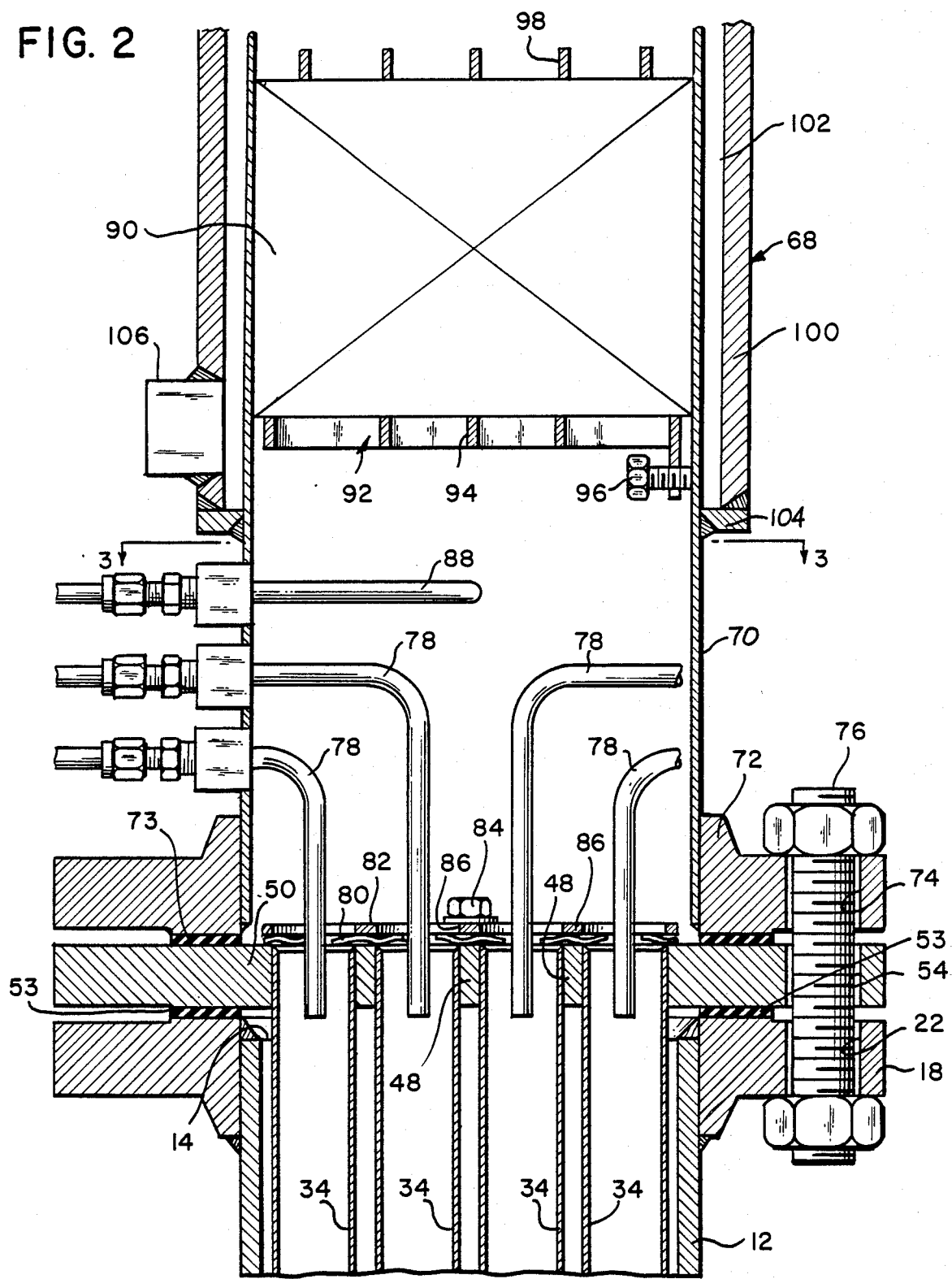

An upper bonnet 68 as shown in FIGS. 1 and 2, has a bonnet wall 70 with an upper bonnet flange 72 secured to the lower end thereof in surrounding relation and immediately above upper tube sheet 50, with a gasket seal 73 positioned between tube sheet 50 and flange 72. Flange 72 likewise includes a plurality of spaced apertures 74 therearound in alignment with apertures 22 and 54, and a plurality of nut and bolt arrangements 76 secure upper shell flange 18, upper tube sheet 50 and upper bonnet flange 72 together, as shown in FIG. 2.

Figure 3:
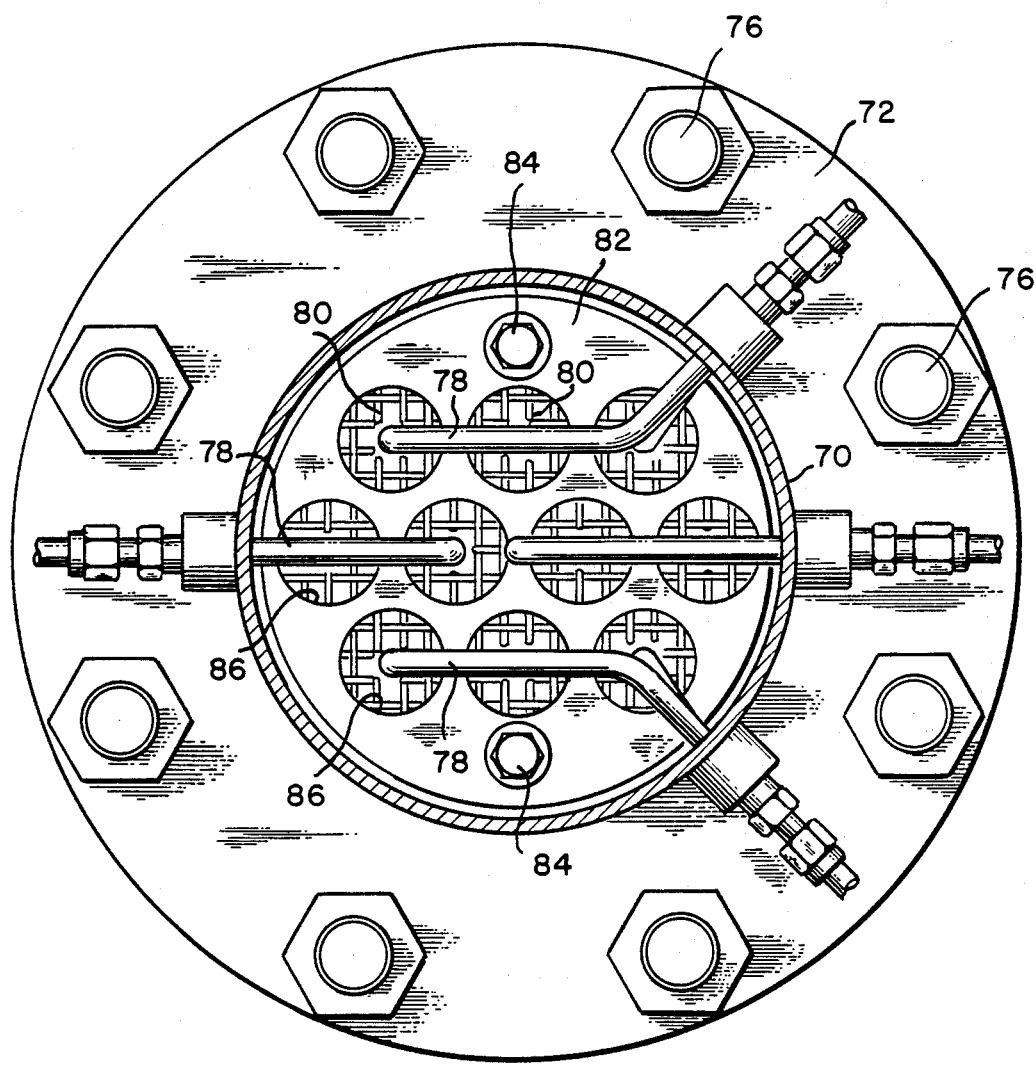

A plurality of coating formula feed tubes 78 extend through bonnet wall 70 and are positioned above and extend into the upper ends of vaporization columns 34 for supplying a coating compound thereto. As shown, best in FIGS. 2 and 3, a packing hold-down 80 preferably formed of a mesh wire cloth is positioned over vaporization columns 34, and a packing hold-down plate 82 is positioned over packing hold-down 80 and is secured to upper tube sheet 50 by bolts 84. Packing hold-down plate 82 includes a plurality of apertures 86 which are arranged to coincide with the upper open ends of vaporization columns 34. Accordingly, feed tubes 78 extend through apertures 86 and packing hold-down 80 into the upper ends of vaporization columns 34.

Continuing upwardly from feed tubes 78, a vapor temperature probe 88 extends through bonnet wall 70 for detecting the temperature of the vaporized coating compound as it exits vaporizer 10.

A demister 90 may be provided, which may be a 5¼ inch by 4 inch mesh demister, positioned above temperature probe 88, for collecting mist contained within the exiting vaporized coating compound and gas, that is, to prevent entrained liquid droplets from exiting the vaporizer. Demister 90 is supported by a demister support plate 92 having a plurality of open areas 94 through which the vaporized coating compound can travel to demister 90. Demister support plate 92 is secured to bonnet wall 70 by three bolts 96. In addition, a demister hold-down plate 98 is secured to bonnet wall 70 immediately above demister 90, so as to sandwich demister 90 between plates 92 and 98.

Upper bonnet 68 further includes a jacket wall 100 positioned in surrounding relation to bonnet wall 70 so as to form an annular clearance 102 therebetween. The lower end of jacket wall 100 is secured to bonnet wall 70 by plate 104 so as to seal the lower end of clearance 102. A hot oil inlet 106 is formed at the lower end of jacket wall 100 to supply hot oil to clearance 102 so as to maintain the temperature of the vaporized coating compound at a desired temperature while it travels through demister 90 and out through the upper end of vaporizer 10, and thereby prevent condensation.

An upper bonnet jacket cap 108 is secured to the upper end of upper bonnet jacket wall 100, and likewise, an upper bonnet cap 109 is secured to upper bonnet wall 70. A hot oil outlet 110 is secured to the upper end of upper bonnet jacket cap 108 so as to remove the hot oil from clearance 102. Further, a vapor outlet nozzle 112 extends through the upper bonnet jacket cap 108 and upper bonnet cap 109 in sealing relation therewith to remove the vaporized coating compound entrained in the gas, from vaporizer 10. Vapor outlet nozzle 112 thereby constitutes the process outlet of vaporizer 10.

Referring to FIGS. 1 and 4, the inlet portion of vaporizer 10 will now be described.

As with the outlet section, a packing support plate 114 is secured to lower tube sheet 60 immediately below the lower ends of vaporization columns 34, by bolts 116, so that apertures 118 in packing support plate 114 are aligned with the open lower ends of vaporization columns 34. Packing supports 120, preferably in the form of mesh wire cloth cones, are secured to the upper surface of packing support plate 114 in surrounding relation to apertures 118 so as to extend into the lower ends of vaporization columns 34. Packing supports 120 permit the entry of a carrier gas through the lower open ends of vaporization columns 34.

A lower bonnet 122 has a lower bonnet wall 124, having a lower bonnet flange 126 secured around the upper end thereof immediately below lower tube sheet 60. Flange 126 includes a plurality of apertures 128 in spaced relation therearound and in alignment with apertures 24 and 64. Thus, nut and bolt arrangements 130 extend through apertures 24, 64 and 128 to secure lower shell flange 20, lower tube sheet 60 and lower bonnet flange 126 together. A gasket seal 127 is provided between lower tube sheet 60 and lower bonnet flange 126 for providing a seal at the lower end of vaporization columns 34. A gas feeding pipe 132 extends through lower bonnet wall 124 to supply a carrier gas thereto. The carrier gas travels upwardly through apertures 118 and packing supports 120 to vaporization columns 34, whereby the coating compound vaporizes and becomes entrained in the gas and is carried upwardly out of vaporizer 10.

As with upper bonnet 68, lower bonnet 122 includes a jacket wall 134 in surrounding relation to bonnet wall 124 and spaced therefrom to define an annular clearance 136 therebetween. A lower bonnet jacket cap 138 is secured to the lower end of lower jacket wall 134 and a lower bonnet cap 139 is secured to the lower end of bonnet wall 124, so as to maintain the clearance 136. At the lower end of lower bonnet jacket cap 138, a hot oil inlet 140 is provided for supplying a lot oil to clearance 136, such oil being removed at hot oil outlet 142 at the upper end of lower bonnet jacket 122. As a result, the gas temperature is maintained prior to entering vaporization columns 34, that is, excessive heat loss in the gas feed is prevented. Further, a drain 144 is provided at the lower end of lower bonnet cap 139 for draining any coating compound which is not vaporized and which falls through the lower open ends of vaporization columns 34.

In operation, liquid coating compound, which may be pre-heated, is introduced into the top of each vaporization column 34 and trickles downwardly, wetting the packing surface. Gas, which is preferably pre-heated, enters gas feeding pipe 132 and travels upwardly through the bottom of each vaporization column 34 as a continuous phase. Because of the heat exchange relation with the hot oil, the coating compound is vaporized and carried upwardly entrained in the carrier gas. In this regard, vaporization columns 34 must be of sufficient height to allow substantially complete vaporization. By providing numerous smaller diameter vaporization columns 34, the packing's temperature gradient in the radial direction is kept small, allowing effective vaporization from the packing's entire wetted surface area. Because of the large surface area for mass and heat transfer, the surface temperature required for vaporization is reduced and there is a reduction in the thermal decomposition of the organotin coating compound.

The capacity of each column 34 is based on the compound's vapor pressure and thermal stability, the columns' loading characteristics and the ability to transfer heat from the column wall to the column interior. Under column loading limited operation, the capacity is approximately proportional to the square of the diameter of vaporization columns 34, and the mass transfer area is also proportional to the square of the diameter. As the column's diameter is increased, however, the packing's radial temperature gradient is increased, reducing the packing's effectiveness towards the column's radial center.

Thus, by providing multiple columns in parallel with each other, the capacity of the vaporizer is increased beyond the capacity of the largest practical diameter of single column. Although means must be provided for distributing both the gas and liquid feed streams among the parallel columns, this has been accomplished easily by the present invention, as described above.

Referring now to FIGS. 6–12, there is shown another embodiment of the present invention. Specifically, in the external feed embodiment of FIGS. 1–5, a plurality of feed tubes 78 are provided by supplying the coating compound specifically to each individual vaporization column 34. In the embodiment of FIGS. 6–12, which is known as the internal feed distribution embodiment, a single feed tube is provided.

Thus, referring to FIGS. 6–12, elements corresponding to the same elements as those in the embodiments of FIGS. 1–5 are represented by the same reference numerals, and a detailed explanation thereof will be omitted herein for the sake of brevity.

Figure 6:
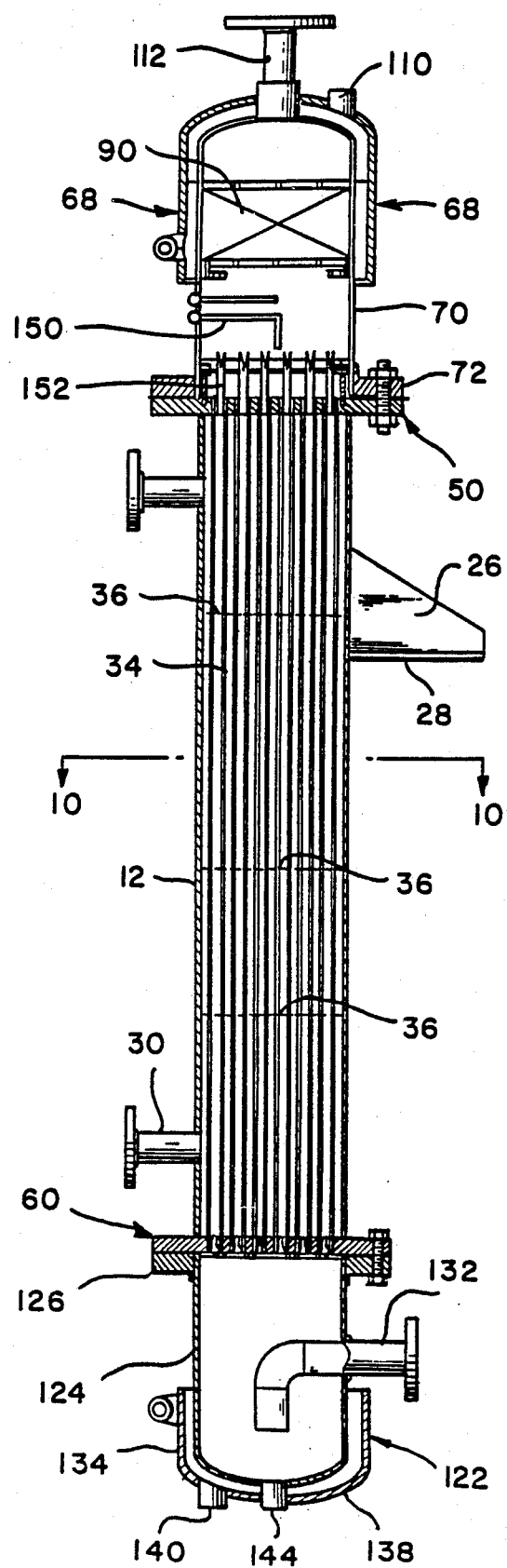
Figure 7:
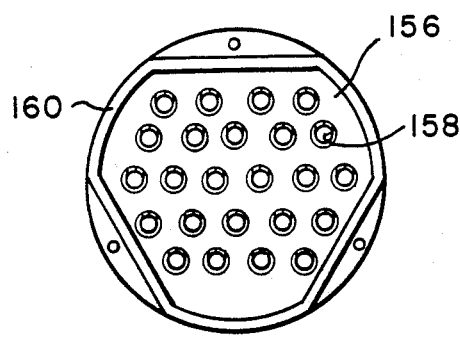

As shown in FIG. 6, in place of the plurality of feed tubes 78, a single feed tube 150 is provided and extends through upper bonnet wall 70 of upper bonnet 68. Further, upper tube sheet 50 is secured directly to the upper end of the shell 12 so that only upper tube sheet 50 and flange 72 are connected together.

Figure 8:
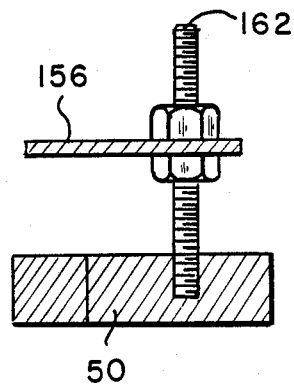
Figure 9:
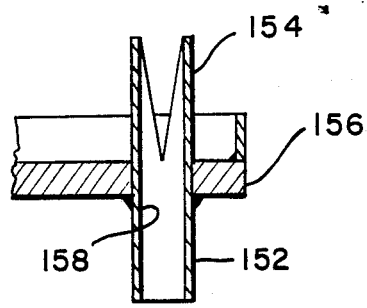
Figure 10:
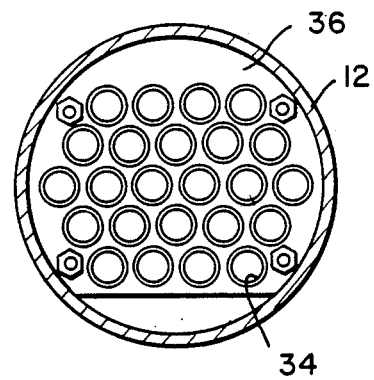
Figure 11:
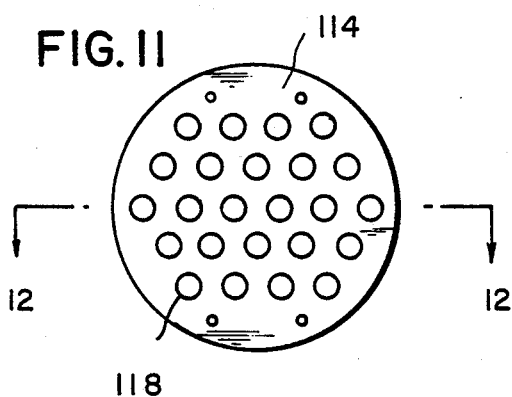
Figure 12:
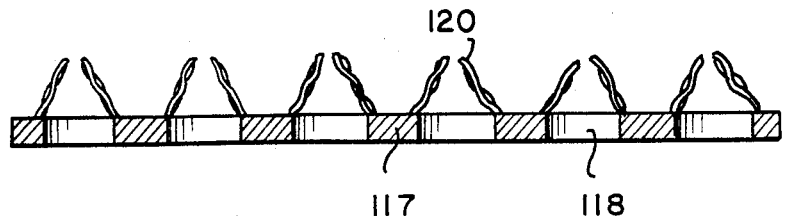

The feed distribution system is comprised of a plurality of distribution tubes 152 extending into the upper tube sheet 50 at positions directly above the upper open ends of vaporization columns 34. The upper end of each distribution tube 152, as shown in FIGS. 6 and 9, is provided with a V-notch portion 154. A feed distributor plate 156 is secured above and parallel to upper tube sheet 50, and the V-notch portions 154 of distribution tubes 152 extend through apertures 158 therein and are welded thereto. Specifically, feed distributor plate 156 is positioned at a level substantially equal to the lowest portion of the V-shape of V-notch portions 154. In addition, distributor plate 156 is provided with upstanding walls 160 so as to provide a liquid containing area therein. Feed distributor plate 156 can be secured to upper tube sheet 50 in spaced relation by means of nut and bolt arrangements 162, as shown in FIG. 8. Nut and bolt arrangements 162 also serve as a means of leveling the feed distribution plate 56, thereby insuring a substantially equal distribution of coating compound to each vaporization column 34. Thus, with the internal feed embodiment of FIGS. 6–12, liquid coating material is supplied through feed tube 150 so that the liquid deposits on feed distributor plate 156. As the level of the liquid rises, it seeps in through the V-notch portions 154 into the interior of vaporization columns 34 to provide equal distribution therein. In all other respects, the internal feed embodiments of FIGS. 6–12 is substantially the same as the external feed embodiment of FIGS. 1–4.

It will be appreciated, however, that the number of vaporization columns 34 for the internal feed embodiment of FIGS. 6–12 is twenty-four. The internal distribution is used because providing individual feed tubes to such a large number of columns 34 would be impractical.

The invention now will be illustrated by reference to the following examples.

EXAMPLE 1

Monobutyltin trichloride (MBTC) was fed at a controlled rate into the oil jacketed, packed column vaporizer described herein, using a variable stroke metering pump. The column comprised a single 1 inch o.d.×0.049 inch wall×60 inches tall nickel 200 vaporization column running co-axially through a 1½ inch Sch 40 carbon steel shell. The shell was equipped with 1 inch flanged hot oil inlet and outlet nozzles which were separated by a vertical distance of 48 inches and oriented at 180 degrees relative to each other about the major axis of the vaporizer. Oil circulated through the annular space between the vaporizer column and the shell at a flow rate sufficient to provide a temperature difference between the oil inlet and outlet of no more than 1 degree F. The total height of the annular oil cavity was 53.5 inches. The vaporization column extended a short distance from the shell to which it was sealed, thereby preventing escape of oil from the annular space. A packing support fabricated from 8 mesh 316 SS wire cloth was positioned at the bottom of the vaporization column supporting a 54 inch deep bed of ¼ inch perforated Ni 200 saddles. The upper 50¾ inches of the packed bed was heated by the annular oil cavity. The bottom bonnet was fluidly connected to the bottom of the vaporization column to provide a gas inlet port through which pre-heated air was introduced into the bonnet at a controlled flow rate, and a drain having a sight glass was provided therein. The upper bonnet was fluidly connected to the top of the vaporization column; it contained a vapor thermocouple, vapor outlet port, and a ¼ inch liquid feed tube, the latter introducing MBTC to the top of the packed bed on the major axis of the vaporizer.

The apparatus described above represents a single column of the multiple, parallel packed column vaporizer of the invention, which can be assembled using a plurality of such single columns within a single shell.

In operation, at a fixed air feed rate, the MBTC feed rate was increased in several steps until either an accumulation of liquid was observed in the lower bonnet sight glass or flooding occurred. The entering air was pre-heated to 390–400 degrees F. MBTC entered the column at ambient temperature. At air feed rates of up to 0.25 SCFM per column, the maximum MBTC feed rate was proportional to the air flow. The resulting vapor contained 33 mole % MBTC, which exited the vaporizer at 373 degrees F.

EXAMPLE 2

Example 1 was repeated except that MBTC was preheated using the circulating hot oil stream. Improved results were obtained.

In addition to the coating chemicals used herein, other vaporizable chemicals known in the art may be used as well.

Having described specific preferred embodiments of the invention with reference to the accompanying drawings, it will be appreciated that the present invention is not limited to those precise embodiments, and that various changes and modifications can be effected therein by one of ordinary skill in the art without departing from the spirit or scope of the invention as defined in the appended claims.

What is claimed is:

1. Apparatus for vaporizing a coating compound having a relatively low decomposition temperature to produce a coating mixture comprised of a high concentration of vaporized coating compound entrained in a gas, the vaporizer comprising:
   a shell;
   a plurality of vaporization columns arranged in said shell in a substantially vertical orientation, said vaporization columns having inner walls and upper and lower open ends;
   distribution means for distributing said coating compound substantially equally to said upper open ends of said vaporization columns;
   heating means for heating said vaporization columns to vaporize said coating compound therein; and
   gas supply means for supplying said gas to said lower ends of said vaporization columns to produce said coating mixture.

2. Apparatus according to claim 1; wherein said vaporization columns are packed.

3. Apparatus according to claim 1; wherein said distribution means includes a plurality of feed tube means for supplying said coating compound individually to said upper open ends of said vaporization columns.

4. Apparatus according to claim 1; wherein said distribution means includes a plurality of distribution tube means positioned above the open ends of respective vaporization columns; feed distributor plate means secured to upper ends of said distribution tube means for supplying said coating compound thereto; and feed means for supplying said coating compound to said feed distributor plate means.

5. Apparatus according to claim 4; wherein each said distribution tube means has an upper V-notch portion with a lower end of the V-notch portion substantially coplanar with said feed distributor plate means.

6. Apparatus according to claim 1; wherein said housing includes a shell surrounding said plurality of vaporization columns in a sealing relation; and said heating means includes fluid inlet means for supplying a heated fluid to said shell and fluid outlet means for discharging said fluid from said shell, wherein said heated fluid vaporizes said coating compound in said vaporization columns in a heat exchanging relation.

7. Apparatus according to claim 1; wherein said housing includes a shell surrounding said vaporization columns in a sealing manner; and said gas supply means includes lower bonnet means secured to a lower end of said shell for supplying said gas to said lower ends of said vaporization columns.

8. Apparatus according to claim 7; further including upper bonnet means secured to an upper end of said shell for discharging said coating vapor mixture from said apparatus.

9. Apparatus according to claim 8; wherein said upper bonnet means includes heat exchanger means for preventing condensation of said vaporized coating compounds as it exits the apparatus.

10. Apparatus according to claim 8; further including temperature probe means positioned in said upper bonnet means for detecting the temperature of said coating mixture, for use in regulating said heating means.

11. Apparatus according to claim 8; further including mist eliminator means positioned in said upper bonnet means to prevent entrained liquid droplets from exiting said apparatus.

12. Apparatus according to claim 7; wherein said lower bonnet means includes heat exchanger means for preventing excessive heat loss of said gas supplied to said apparatus.

13. In an apparatus for vaporizing a coating compound having a relatively low decomposition temperature to produce a coating mixture comprised of a high concentration of vaporized coating compound entrained in a gas, wherein the vaporizer includes:
   a shell;
   heating means for heating said coating compound so as to vaporize said coating compound; and
   gas supply means for supplying said gas to mix with said vaporized coating compound so as to produce said coating mixture;
   the improvement characterized in that said apparatus includes:
   a plurality of vaporization columns arranged in said shell in a substantially vertical orientation, said vaporization columns having inner walls and upper and lower open ends;
   distribution means for distributing said coating compound substantially equally to said upper open ends of said vaporization columns; and wherein:
   said heating means heats said plurality of vaporization columns to vaporize said coating compound therein; and
   said gas supply means supplies said gas to said lower ends of said vaporization columns to produce said coating mixture.

14. Apparatus according to claim 13; wherein said vaporization columns are packed.

15. Apparatus according to claim 13; wherein said distribution means includes a plurality of feed tube means for supplying said coating compound individually to said upper open ends of said vaporization columns.

16. Apparatus according to claim 13; wherein said distribution means includes a plurality of distribution tube means positioned above the open ends of respective vaporization columns; feed distributor plate means secured to upper ends of said distribution tube means for supplying said coating compound thereto; and feed means for supplying said coating compound to said feed distributor plate means.

17. Apparatus for vaporizing a chemical having a relatively low decomposition temperature to produce a chemical mixture comprised of a high concentration of vaporized chemical entrained in a gas, the vaporizer comprising:
   (a) a shell;

(b) a plurality of vaporization columns arranged in said shell in a substantially vertical orientation, said vaporization columns having inner walls and upper and lower open ends;

(c) distribution means for distributing said chemical substantially equally to said upper open ends of said vaporization columns, said distribution means including (i) a plurality of distribution tube means positioned above the open ends of respective vaporization columns;

(ii) feed distributor plate means secured to upper ends of said distribution tube means for supplying said chemical thereto; and (iii) feed means for supplying said chemical to said feed distributor plate means; and (iv) each said distribution tube means has an upper V-notch portion with a lower end of the V-notch portion substantially coplanar with said feed distributor plate means;

heating means for heating said vaporization columns to vaporize said chemical therein; and gas supply means for supplying said gas to said lower ends of said vaporization columns to produce said chemical mixture.

* * * * *